United States Patent
Kameyama et al.

(10) Patent No.: US 7,056,768 B2
(45) Date of Patent: Jun. 6, 2006

(54) CUTTING METHOD AND METHOD OF MANUFACTURING SEMICONDUCTOR DEVICE

(75) Inventors: Koujiro Kameyama, Gunma (JP); Kiyoshi Mita, Tochigi (JP)

(73) Assignees: Sanyo Electric Co., Ltd., Osaka (JP); Kanto Sanyo Semiconductors Co., Ltd, Gunma (JP)

( * ) Notice: Subject to any disclaimer, the term of this patent is extended or adjusted under 35 U.S.C. 154(b) by 117 days.

(21) Appl. No.: 10/892,398

(22) Filed: Jul. 16, 2004

(65) Prior Publication Data

US 2005/0012193 A1 Jan. 20, 2005

(30) Foreign Application Priority Data

Jul. 16, 2003 (JP) ............................. 2003-275400

(51) Int. Cl.
*H01L 21/50* (2006.01)
(52) U.S. Cl. .................. 438/115; 438/113; 438/110; 438/111; 438/112; 438/464; 438/460
(58) Field of Classification Search ................. None
See application file for complete search history.

(56) References Cited

U.S. PATENT DOCUMENTS 6,841,414 B1 * 1/2005 Hu et al. .................... 438/106

FOREIGN PATENT DOCUMENTS

JP 2001-077055 3/2001

* cited by examiner

*Primary Examiner*—Luan Thai
(74) *Attorney, Agent, or Firm*—Fish & Richardson P.C.

(57) ABSTRACT

A cutting method for separating individual semiconductor devices by cutting boundary portions in a group of semiconductor devices made up by arranging a plurality of semiconductor devices in which a ductile first layer and a second layer are stacked on a peripheral side thereof, the cutting method comprises a cutting step of cutting the first and second layers by moving a first rotary body from the boundary portions of the group of semiconductor devices in the direction in which the first and second layers are stacked; and a burr removal step of removing burrs from the first layer by moving a second rotary body, softer than the first rotary body and wider than the first rotary body in the direction of rotational axis, from the cut boundary portions of the group of semiconductor devices in the direction in which the first and second layers are stacked.

14 Claims, 11 Drawing Sheets

CUTTING METHOD AND METHOD OF MANUFACTURING SEMICONDUCTOR DEVICE

CROSS-REFERENCE TO RELATED APPLICATIONS

The present application claims priority upon Japanese Patent Application No. 2003-275400 filed on Jul. 16, 2003, which is herein incorporated by reference.

BACKGROUND OF THE INVENTION

1. Field of the Invention

The present invention relates to a cutting method and a method of manufacturing a semiconductor device, capable of effectively removing burrs.

2. Description of the Related Art

In semiconductor device manufacturing steps, steps are performed such as a cutting step of separating each partitioned region (chip: "semiconductor device"), in which a given circuit pattern is formed on a semiconductor wafer ("group of semiconductor devices"), using a cutting device called dicer or dicing, (See Japanese Patent Application Laid-open Publication No. 2001-77055), and a cutting step of separating each partitioned region (package: "semiconductor device") from a leadframe ("group of semiconductor devices") in plate form to which chips are mounted and wire-bonded and that is sealed by a sealing agent having an insulating property.

Here, the semiconductor wafer cutting step is performed by moving the semiconductor wafer in a direction along a cutting line for cutting by an annular cutting blade that is driven to rotate. It is to be noted that, in silicon wafers, a metal wiring layer ("first layer"), made of a ductile metal such as aluminum or copper, is stacked on top of a silicon substrate ("second layer") that exhibits hard and brittle properties, and the metal wiring layer and the silicon substrate stacked at each boundary between chips are cut in the cutting step.

On the other hand, the leadframe cutting step is carried out similarly by moving the leadframe in a direction along a cutting line for cutting by an annular cutting blade that is driven to rotate. It is to be noted that, at least on the side surface of each of the packages in a leadframe after sealing, a hard and brittle sealing agent layer ("second layer") such as thermosetting resin or thermoplastic resin is stacked on top of electrodes ("first layer"), made of copper, aluminum or iron-nickel alloy, on the mounting surface side, and the electrodes and the sealing agent layer stacked at each boundary between chips are cut in the cutting step.

While a soft and ductile metal material such as copper or aluminum is cut in the aforementioned cutting steps, it is known that cutting such a metal material produces burrs (excess material, debris) on the cut cross-sections.

In this case it is possible that electrodes (bonding pads) arranged at the perimeter portion of the chip front surface or electrodes (external terminals) arranged at the perimeter portion of the package mounting surface could be short-circuited via the produced burrs, thus resulting in increased manufacturing defects of semiconductor devices.

Further, fine pitch techniques are increasingly used as a result of recent trends toward downsizing and thickness reduction of semiconductor devices, possibly resulting in aggravating the aforementioned problem if burrs are produced between reduced pitch spacings.

SUMMARY OF THE INVENTION

In light of the above, it is an object of the present invention to provide a cutting method capable of effectively removing burrs.

In order to achieve the above object, according to a first aspect of the present invention there is provided a cutting method for separating individual semiconductor devices by cutting boundary portions in a group of semiconductor devices made up by arranging a plurality of semiconductor devices in which a ductile first layer and a second layer are stacked on a peripheral side thereof, the cutting method comprising a cutting step of cutting the first and second layers by moving a first rotary body from the boundary portions of the group of semiconductor devices in the direction in which the first and second layers are stacked; and a burr removal step of removing burrs from the first layer by moving a second rotary body, softer than the first rotary body and wider than the first rotary body in the direction of rotational axis, from the cut boundary portions of the group of semiconductor devices in the direction in which the first and second layers are stacked.

In order to attain the above object, according to a second aspect of the present invention there is provided a cutting method for separating individual semiconductor devices by cutting boundary portions in a group of semiconductor devices made up by arranging a plurality of semiconductor devices in which a ductile first layer and a second layer are stacked on a peripheral side thereof, the cutting method comprising a first cutting step of cutting the first layer and removing burrs from the first layer by moving a first rotary body from the boundary portions of the group of semiconductor devices on the side of the first layer in the direction in which the first and second layers are stacked; and a second cutting step of cutting the second layer by moving a second rotary body, harder than the first rotary body and narrower than the first rotary body in the direction of rotational axis, from the boundary portions in which the first layer is cut in the direction in which the first and second layers are stacked.

It is possible according to the present invention to remove burrs in a first layer having a ductile property when the first and second layers are cut. Thus, the present invention allows provision of a cutting method capable of effectively removing burrs.

Features of the present invention will become more apparent from the accompanying drawings and the description of the present specification.

DETAILED DESCRIPTION OF THE INVENTION

An embodiment of the present invention will be described hereinbelow with reference to the drawings.

<Configuration of Semiconductor Device>

Figure 1:
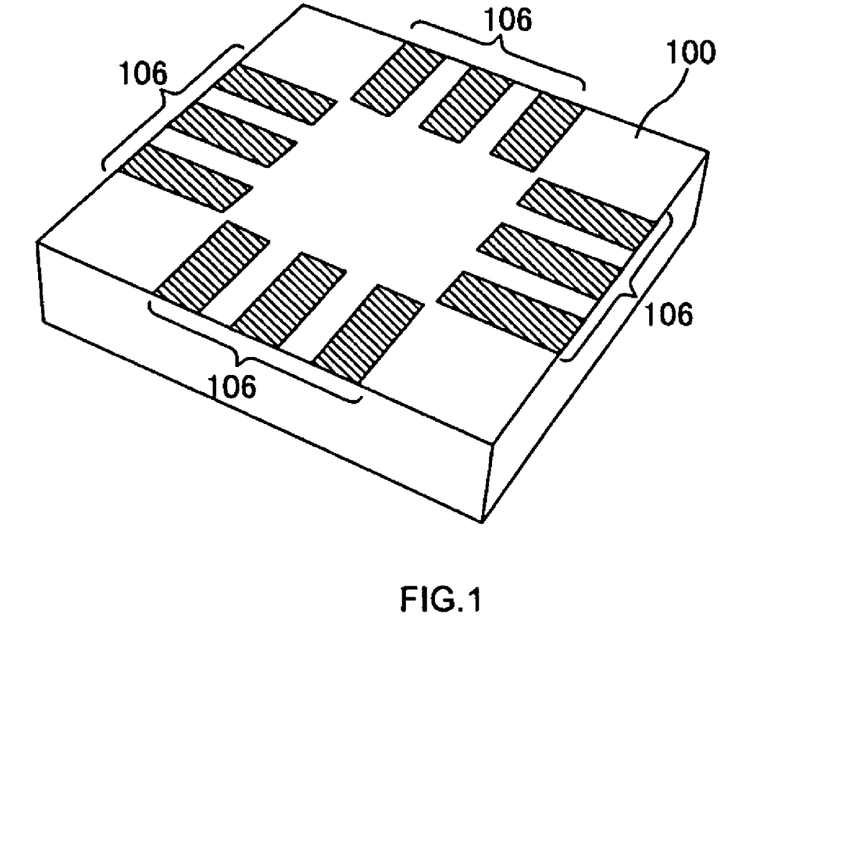
FIG. 1 is a perspective view showing a mounting surface of a semiconductor device according to an embodiment of the present invention.

FIG. 1 is a perspective view showing an embodiment of a semiconductor device 100 manufactured based on a cutting method according to the present invention.

As the semiconductor device 100 according to the present invention, a nonleaded semiconductor device such as VQFN (Very thin Quad Flat Nonleaded Package) or VSON (Very Thin Small Outline Nonleaded Package) may be used, as shown in the same figure, in which external terminals 106 are exposed from the mounting surface (bottom surface), a surface that is joined to a printed circuit board via a joining agent. It is needless to say that the semiconductor device 100 according to the present invention is not limited to nonleaded semiconductor devices and that other CSPs (Chip Size Packages) such as BGA (Ball Grid Array) may be used. Package employing a printed circuit board or flexible printed board may also be used such as FBGA (Fine-Pitch BGA) or FLGA (Fine-Pitch Land Grid Array). The following description will be made taking a nonleaded semiconductor device as an example.

Figure 2:
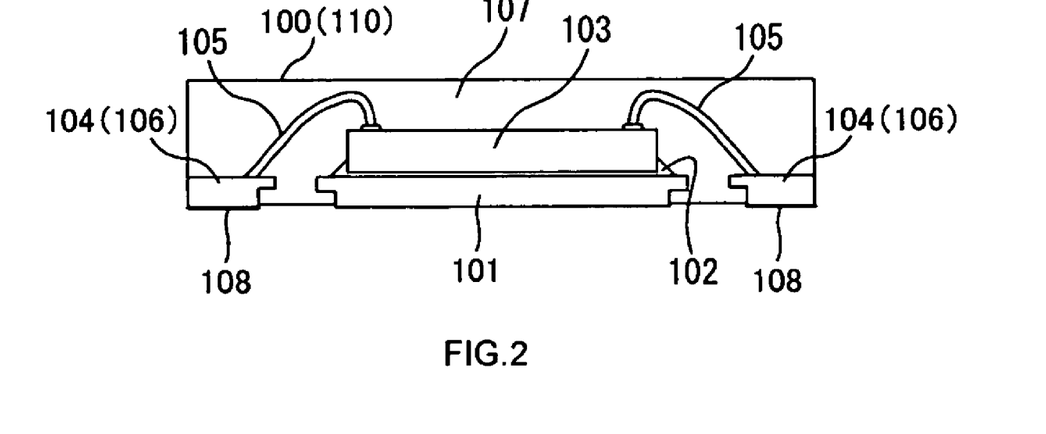
FIG. 2 is a sectional view showing the semiconductor device according to the embodiment of the present invention.

FIG. 2 is a sectional view of the semiconductor device 100. On a die pad 101 made of copper, etc., a semiconductor element 103 is fastened (die-bonded) via a die-bonding joining agent 102 such as silver paste, as shown in the same figure. There are formed electrode pads (not shown) on the front surface of the semiconductor element 103, with the electrode pads and bonding pads 104, made of copper or other material, electrically connected (wire-bonded) via metal thin wires 105. It is to be noted that while the bonding pads 104 adopt a shape having a protruding portion on the side of the upper surface of the semiconductor device 100 for enhanced adhesion to a sealing agent 107 (anchor effect), the bonding pads 104 may be naturally shaped without the protruding portion.

Being electrically connected to each other, the die pad 101, the semiconductor element 103 and the bonding pads 104 are sealed by the sealing agent 107 having an insulating property, thus forming a sealed body 110. It is to be noted that thermosetting resin such as epoxy resin (in the case of transfer molding method) and thermoplastic resin such as polyimide resin and poly phenylene sulfide (in the case of injection molding method) are among agents that can be used as the sealing agent 107.

After sealing, the bottom surface of the die pad 101 may be unexposed or exposed on the mounting surface of the sealed body 110. When the bottom surface of the die pad 101 is unexposed, insulating property of the die pad 101 and the semiconductor element 103 is reliably protected. When the bottom surface of the die pad 101 is exposed, the semiconductor device 100 can be made thinner as much as the bottom surface is not sealed. It is also possible to emit heat, generated from the semiconductor device 100, from the bottom surface of the die pad 101.

Following sealing, the bottom surfaces of the bonding pads 104 are exposed on the mounting surface of the sealed body 110. Here, portions of the bonding pads 104, exposed on the mounting surface of the sealed body 110, form the external terminals 106 for joining (mounting) the semiconductor device 100 to the printed wired board via the joining agent. It is to be noted that, on the external terminals 106, there is formed a plated layer 108 such as a solder-plated or metal-plated (e.g., nickel, gold, silver) layer.

The above is an outline of the semiconductor device 100. On the side surfaces of the semiconductor device 100, as shown in FIG. 2, a layer of the sealing agent 107 (hereinafter referred to as a "second layer") such as thermosetting resin or thermoplastic resin that exhibits harder and more brittle properties, is stacked on top of the bonding pads ("first layer") 104, made of a material showing soft and ductile properties such as aluminum or copper.

<Configuration of Cutting Device>

There is provided, among manufacturing steps of the semiconductor device 100 shown in FIGS. 1 and 2, a step of separating the individual semiconductor devices 100 from a conductive foil 700, described later, that is made up by arranging a plurality of the semiconductor devices 100. Here, when boundary portions between the semiconductor devices 100 are cut in the conductive foil 700, the bonding pad 104 and the sealing agent layer 107 are cut together. However, since the bonding pad 104 is made of a material showing soft and ductile properties as described earlier, burrs are readily produced on the cut cross-sections of the bonding pad 104.

Figure 4:
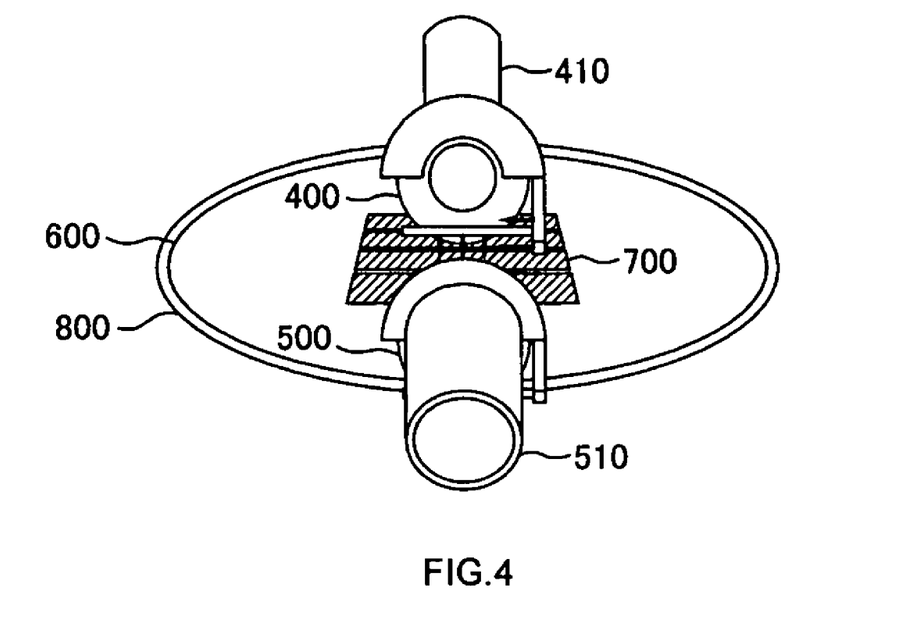
FIG. 4 is a view illustrating an opposed two-axis cutting device according to the embodiment of the present invention.

To suppress generation of burrs, for this reason, the cutting method according to the present invention employs a parallel two-axis cutting device (parallel two-axis dicer or dicing device: "first cutting device") 1000 in which there are provided spindles for two axes with built-in motor having an annular blade attached at the end and the spindles are arranged parallel with each other. It is to be noted that while the following description will be made assuming that the parallel two-axis cutting device 1000 is used, an opposed two-axis cutting device (opposed two-axis dicer or dicing device: "first cutting device"), as shown in FIG. 4, may be used in which spindles for two axes are arranged opposed to each other.

Figure 3:
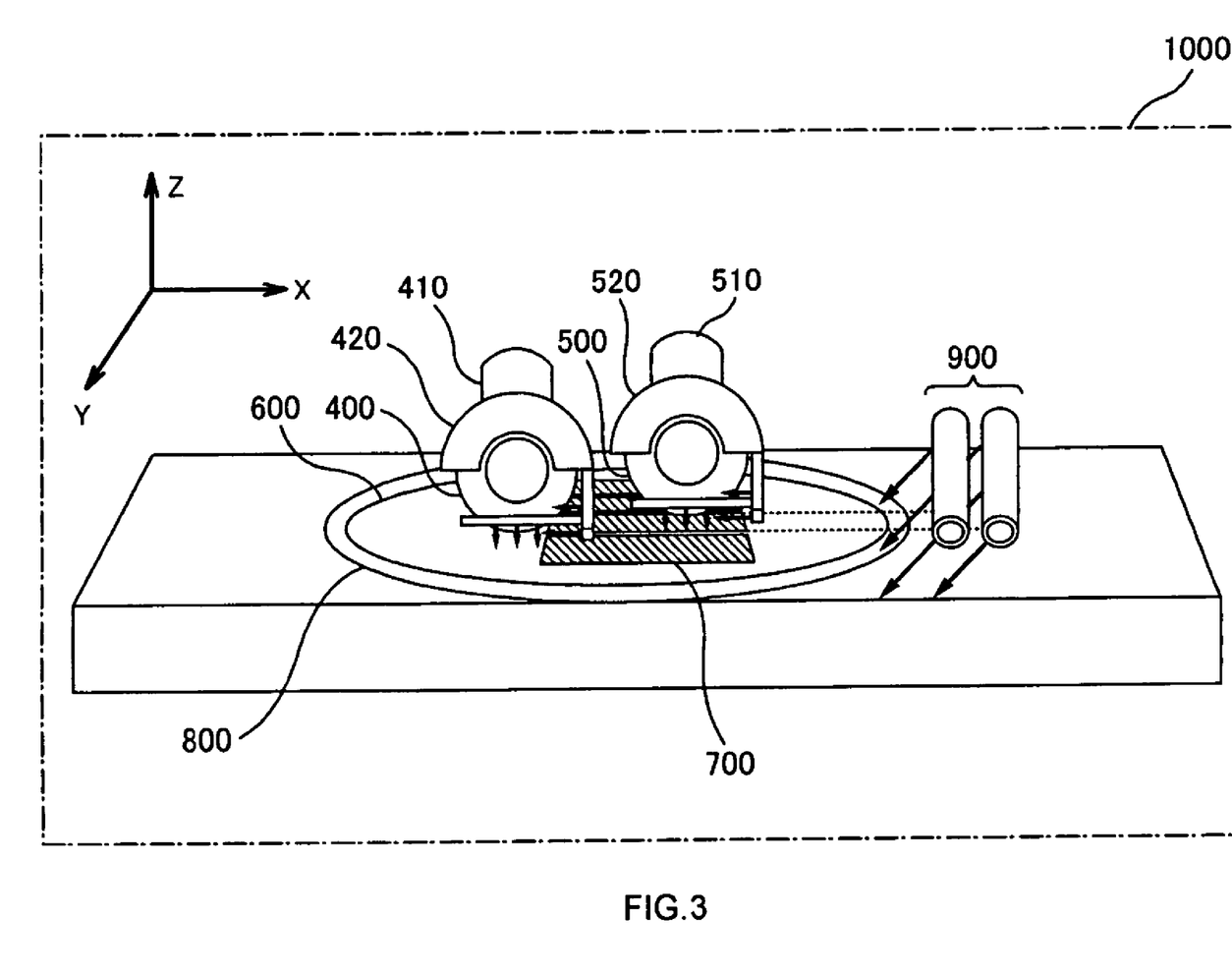
FIG. 3 is a view illustrating a parallel two-axis cutting device according to the embodiment of the present invention.

The parallel two-axis cutting device 1000 comprises a spindle 410 with a cutting blade ("first rotary body") 400 attached at the end, a spindle 510 with a burr removal blade ("second rotary body") 500 attached at the end, a work table 800 for sucking and holding the conductive foil 700 to which a dicing adhesive sheet 600 is affixed, a precleaning nozzle 900 for precleaning the conductive foil 700, cleared of burrs, before transfer to a spin cleaning unit (not shown), and so on.

The cutting blade 400, used in a full-cutting step described later, must be a blade having hardness capable of cutting both the bonding pads and the sealing agent layer 107 formed at the boundary portions in the conductive foil 700. Among blades that can be used as the cutting blade is a diamond blade provided with a diamond grinding wheel at the circumference of a circular disk.

The burr removal blade 500, used in a burr removal step described later, must be a blade for removing burrs produced on the cross-sections of the conductive foil 700 after cutting. It is to be noted that the burr removal blade 500 is made of a material softer than the cutting blade 400. It is preferred that, to remove burrs produced on the cut cross-sections of the bonding pad 104, a blade be used, as the burr removal blade 500, that presents low hardness in conformity with the softness and ductility of the material making up the bonding pad 104. By making the burr removal blade 500 wider than the cutting blade 400 in the direction of rotational axis, it is possible to remove burrs by simultaneously rubbing against the cut cross-sections on both sides as the cutting blade 400 is fed once for cutting.

At the end of the spindle 510, a buff ("second rotary body") used for grinding may be attached in addition to the burr removal blade 500 described earlier. It is to be noted that the buff refers to cloths cut into circular shapes and stitched together to a given thickness or a cloth coated with grinding agent on the outer circumferential surface. The buff may be made of not only cloths but also an alloy of iron, copper, zinc and so on or plastic.

The spindles 410 and 510 are arranged parallel with each other in the direction of the X-axis (see FIG. 3) along a cutting line of the conductive foil 700. Additionally, the spindles 410 and 510 are indexed in the direction of the Y-axis (see FIG. 3), vertical relative to the cutting line, respectively by drive means that are not shown, and, are also fed for cutting in the direction of the Z-axis (see FIG. 3) in which the bonding pads 104 and the sealing agent layer 107 are stacked. The work table 800 is fed for cutting in the direction of the X-axis (see FIG. 3) along a cutting line of the conductive foil 700. Cutting is performed along each of the cutting lines of the conductive foil 700 through a series of these operations of the spindles 410 and 510 and the work table 800. It is to be noted that the work table 800 can be driven to rotate such that the cutting blade 400 and the burr removal blade 500 are positioned on a cutting line of the conductive foil 700.

Figure 5:
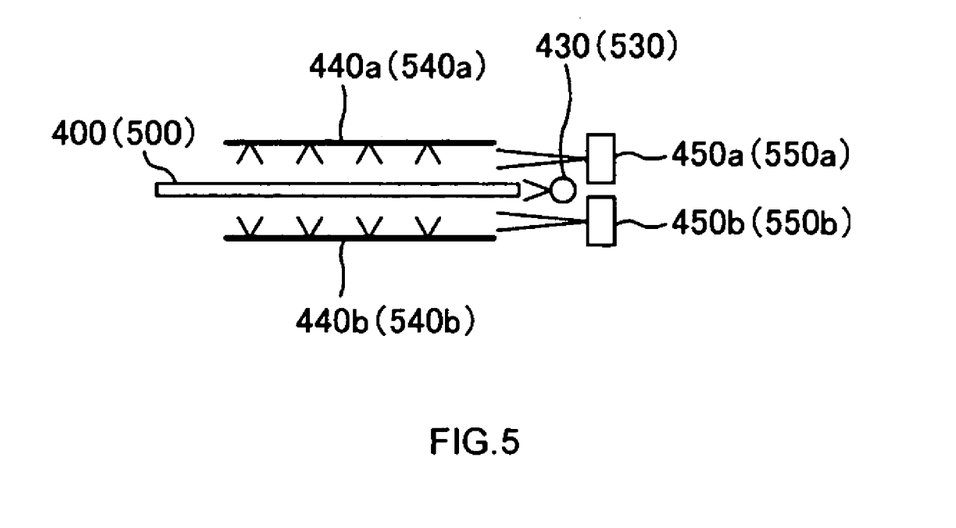
FIG. 5 is a view illustrating the configuration of a surrounding portion of a blade according to the embodiment of the present invention.

Perimeter portions of the cutting blade 400 and the burr removal blade 500 in the parallel two-axis cutting device 1000 are configured as shown in FIG. 5. Here, a description will be made only about the configuration of the perimeter portion of the cutting blade 400.

First, the cutting blade 400 is covered with a flange cover 420 having an opening portion at its lower portion (see FIG. 3). The flange cover 420 is provided with a cutting water nozzle 430, installed on the cutting feed side of the work table 800, a pair of cooling water nozzles 440a and 440b, installed so as to sandwich the cutting blade 400 from the front and back (side of the spindle 410) when the cutting blade 400 is viewed as a partition, and a pair of cleaning water nozzles 450a and 450b installed on the cutting feed side of the work table 800.

Here, if there remains, on the mounting surface, cutting debris (removed "burrs") produced in the course of the full-cutting step (S607) and/or the burr removal step (S608) that will be described later, it will be difficult to remove the cutting debris when the conductive foil 700 is dried later. For this reason, the water ejecting direction is set for each of the nozzles (430, 440, 450) so that the cutting debris flows out to an outer circumferential side of the mounting surface of the conductive foil 700 by the water flow ejected from each of the nozzles (430, 440, 450) at least in either of the full-cutting step (S607) and the burr removal step (S608) that will be described later. This makes the cutting debris less likely to remain on the mounting surface of the conductive foil 700, allowing avoiding manufacturing defects such as short-circuits between electrodes attributable to the cutting debris.

It is to be noted that if the cutting device according to the present invention is employed such as dry cutting, it is unnecessary to use cutting, cooling and cleaning water. As a result, the cutting device may be configured without the nozzles (430, 440, 450).

<Manufacturing Steps of Semiconductor Device>

Figure 6:
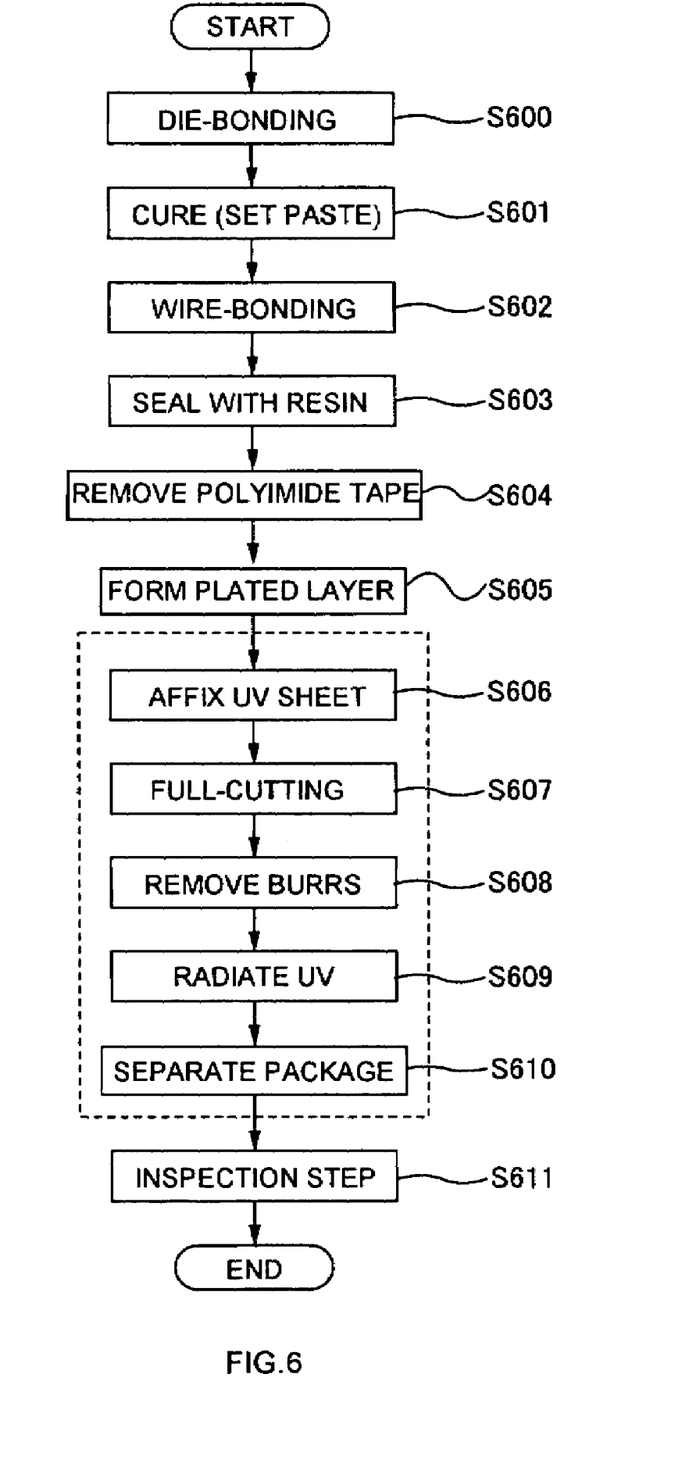
FIG. 6 is a flowchart illustrating manufacturing steps of the semiconductor device according to the embodiment of the present invention.

A description will be given next of the manufacturing steps of the semiconductor device 100 shown in FIGS. 1 and 2, referring as appropriate to FIGS. 7 to 13 and based on the flowchart in FIG. 6.

Die Bonding to Plated Layer Formation

Figure 7:
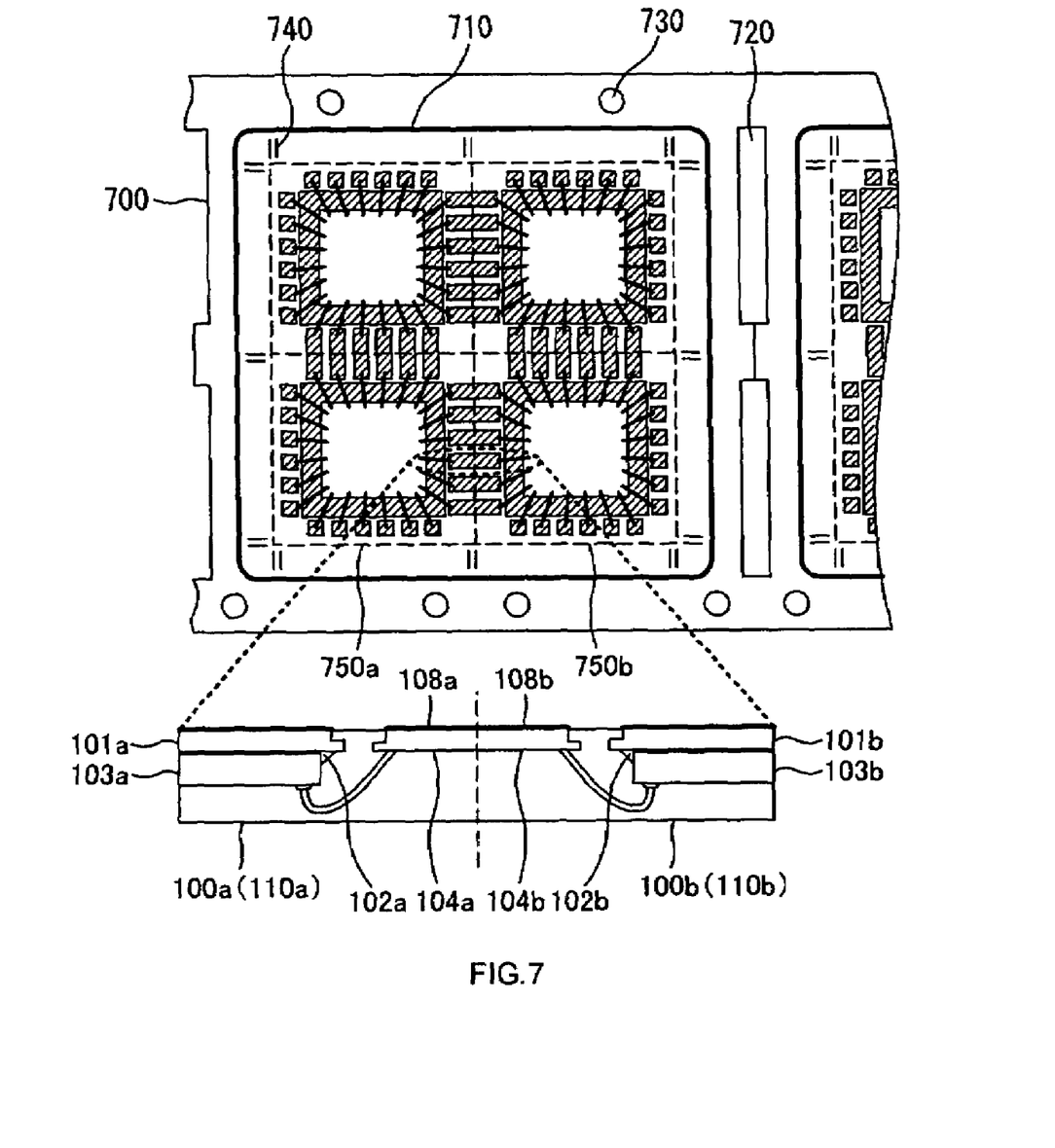
FIG. 7 is a view illustrating a manufacturing step of the semiconductor device according to the embodiment of the present invention.

First, a conductive foil (leadframe) in plate form having conductive property, made of copper, aluminum or iron-nickel alloy is made available. As shown in FIG. 7, there are provided index holes 730 at the upper and lower circumferential edges of the conductive foil 700 for positioning in each step. There are also arranged blocks 710 each having a number of mounting portions ("partitioned regions") 750 in the conductive foil 700, with the blocks 710 arranged via slits 720 serving to absorb stress of the conductive foil 700. It is to be noted that there are provided positioning marks 740 for cutting on the inside of the circumferential edges of the block 710.

Following formation of a resist pattern on the conductive foil 700, etching is performed using the resist pattern as a mask, thus forming the die pad 101 and the bonding pads 104 in each of the mounting portions 750 of the conductive foil 700. It is to be noted that the bonding pads 104 are arranged around the mounting portion 750, with the bonding pads 104 of the adjacent mounting portions 750 connected with each other.

With the conductive foil 700 in this condition, the semiconductor element 103, diced in advance from a semiconductor wafer, is fastened (die-bonded) onto the die pad 101, formed on the mounting portion 750, via the joining agent 102 (S600). After setting of the joining agent 102 by a curing step (S601), electrode pads (not shown), arranged on the perimeter portion on the front surface of the semiconductor element 103, and the bonding pads 104 formed around the mounting portion 750 are electrically connected (wire-bonded) via the metal thin wires 105 (S602). It is to be noted that while face-up mounting by wire-bonding is shown here as the mounting method of the semiconductor element 103, face-down mounting maybe carried out by forming metal pads on the electrode pads (not shown) of the semiconductor element 103.

Then, the conductive foil 700 is sealed as a whole to expose the bonding pads 104 as the external terminals 106 (S603). This results in formation of the sealed body 110, having the bonding pads 104 exposed on the mounting surface side, in the mounting portion 750.

It is possible to prevent sealing of the mounting surface side of the bonding pads 104 by the sealing agent 107 if sealing is conducted with a resin sheet (not shown) such as polyimide tape affixed on the mounting surface side of the conductive foil 700. Further, as a result of pressurization by a plunger, etc., the portion of the resin sheet coating the sealing agent 107 digs slightly into the sealed body 110.

That is, since use of the resin sheet facilitates exposure of the external terminals 106 on the mounting surface of the sealed body 110, it is preferred that the resin sheet be affixed in advance to the conductive foil 700 prior to a sealing step (S603). It is to be noted that if the resin sheet is employed, a step is required for removing the resin sheet from the conductive foil 700 (S604) following the sealing step (S603).

Figure 8:
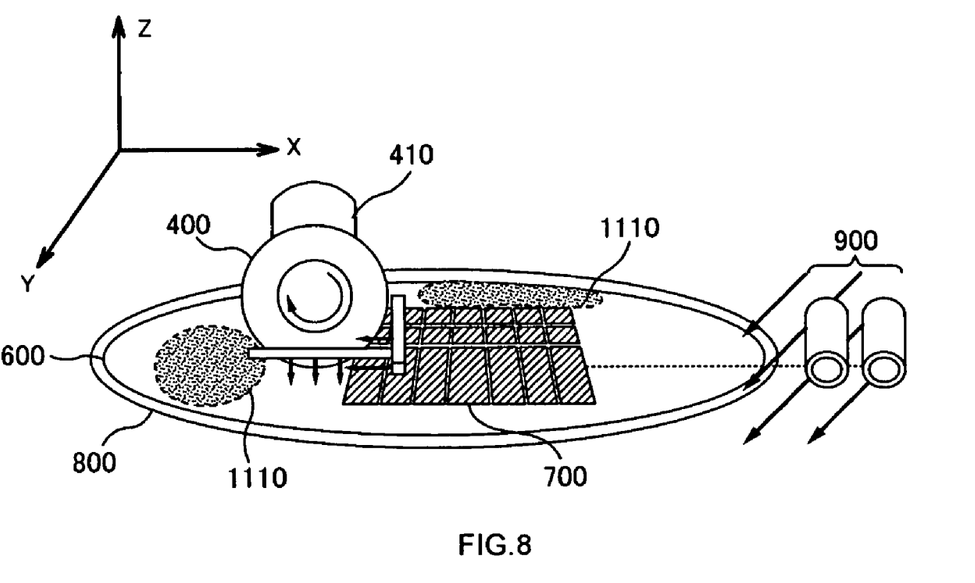
FIG. 8 is a view illustrating a manufacturing step of the semiconductor device according to the embodiment of the present invention.

Here, in the conductive foil 700 following removal of the resin sheet, the external terminals 106 in the adjacent sealed bodies are exposed connected with each other on the mounting surface side. This makes it possible, after connecting the given external terminals 106 to a cathode electrode, to form the plated layer 108 at one time on the external terminals 106 based on the electrolytic plating method (S605). It is to be noted that the electrolytic plating method refers to a method for forming plated layers by providing anode and cathode electrodes in an electrolytic solution such as copper plating bath, arranging an object to be plated as a cathode electrode and applying a voltage between the electrodes, thus allowing electrons to precipitate on the surface of the object to be plated. UV Sheet Affixing to Package Separation Next, with the dicing adhesive sheet 600 affixed to the upper surface of the conductive foil 700 after sealing, a surface completely reverse to the mounting surface (S606) as shown in FIG. 8, the conductive foil 700 is held on the work table 800 of the parallel two-axis cutting device 1000 by vacuum suction.

Here, as the dicing adhesive sheet 600, an ultraviolet setting adhesive sheet (UV sheet), in which ultraviolet setting adhesive agent is formed, is employed for the surface of an ultraviolet transmitting base material film, made, for example, of polyolefin. It is to be noted that the ultraviolet setting adhesive material refers to an adhesive material that sets under ultraviolet radiation for a given amount of time and diminishes in adhesive strength (e.g., acrylic adhesive agent).

Once the conductive foil 700 is sucked and held on the work table 800 together with the dicing adhesive sheet 600, the parallel two-axis cutting device 1000 detects each of boundary portions (cutting lines) between the individual semiconductor devices 100 formed on the mounting surface side of the conductive foil 700. Then, as the spindle 410 is indexed in the direction of the Y-axis (see FIG. 8) and fed in the direction of the Z-axis (see FIG. 8) for cutting, operations are performed such as positioning of the cutting blade 400 onto the detected cutting line.

It is to be noted that when the spindle 410 is fed in the direction of the Z-axis (see FIG. 8) for cutting, full-cutting is carried out by moving the spindle 410 through the bonding pad 104 and the sealing agent layer 107 and down to the dicing adhesive sheet 600.

When the cutting blade 400 is driven to be rotated together with the spindle 410 after the aforementioned positioning, cutting water is ejected from the cutting water nozzle 430 onto the edge of the cutting blade 400, and, at the same time, cooling water is ejected onto the side surfaces of the cutting blade 400 from the pair of cooling water nozzles 440*a* and 440*b*. Further, cleaning water is ejected from the pair of cleaning water nozzles 450*a* and 450*b* onto the front and back of the conductive foil 700 with the cutting blade 400 serving as a partition. It is to be noted that while cutting, cooling and cleaning water is used here as the case of wet cutting, only one of cutting, cooling and cleaning water may be used. In the case of dry cutting, on the other hand, cutting may be performed without using any of cutting, cooling and cleaning water.

Under this condition, cutting of the detected cutting line is performed by feeding the work table 800, on which the conductive foil 700 is sucked and held, in the direction of the X-axis (see FIG. 8) for cutting. Then, the cutting blade 400 is indexed together with the spindle 410 by one pitch, thus carrying out the full-cutting step (S607) as a result of cutting of the succeeding cutting lines.

Figure 9:
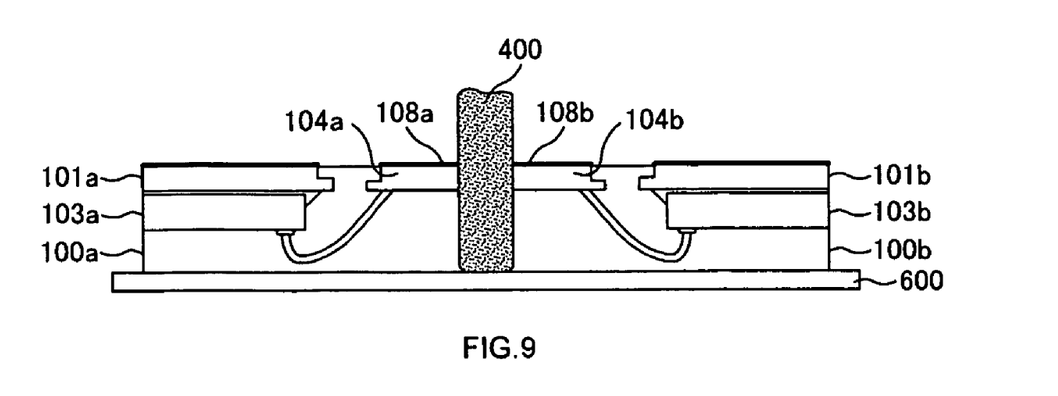
FIG. 9 is a view illustrating a manufacturing step of the semiconductor device according to the embodiment of the present invention.

In the case of conventional dry cutting, a cutting debris 1110 produced in the full-cutting step is trapped by the conductive foil 700 after sealing, causing problems such as short-circuits between electrodes. On the other hand, while the dicing adhesive sheet 600 offers an excellent adhesive property for an object (chip, package) larger than a certain area, the sheet has a poor adhesive property for an extremely small object such as the cutting debris 1110. That is, the cutting debris 1110 is classified into two types, one that is fastened to (trapped by) the dicing adhesive sheet 600 and the other that is trapped by but soon comes off the sheet.

Therefore, the cutting device according to the present invention may employ wet cutting and create a water flow from the dicing region (mounting surface of the conductive foil 700) to its surrounding area, i.e., to the side of the dicing adhesive sheet 600 by at least one of cutting, cooling and cleaning water. This makes the cutting debris 1110, produced in the full-cutting step, less likely to remain in the dicing region, thus allowing the dicing adhesive sheet 600, located around the dicing region, to readily trap the cutting debris 1110 (see FIG. 8).

Figure 10:
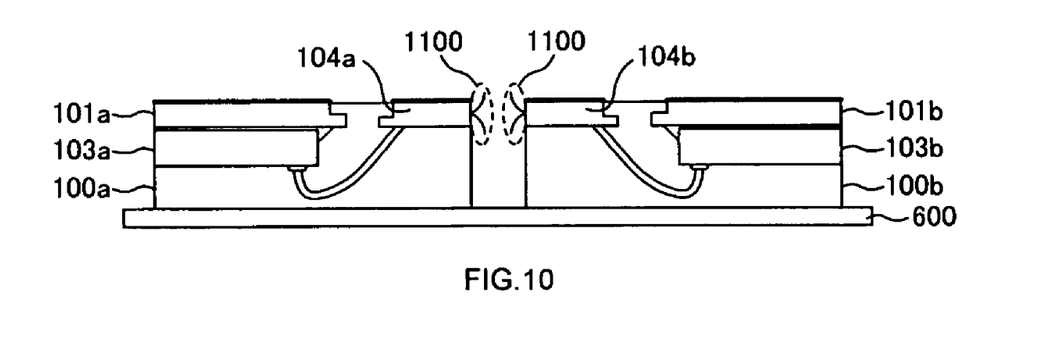
FIG. 10 is a view illustrating a manufacturing step of the semiconductor device according to the embodiment of the present invention.

Burrs 1100 are readily produced on the cut cross-sections formed after the full-cutting step (S607), and particularly on the cut cross-sections of the bonding pads 106, as shown in FIG. 10. Therefore, the burr removal blade 500 is positioned to the cutting line that has been cut as in the case of positioning of the cutting blade 400, thus carrying out the burr removal step (S608).

Figure 11:
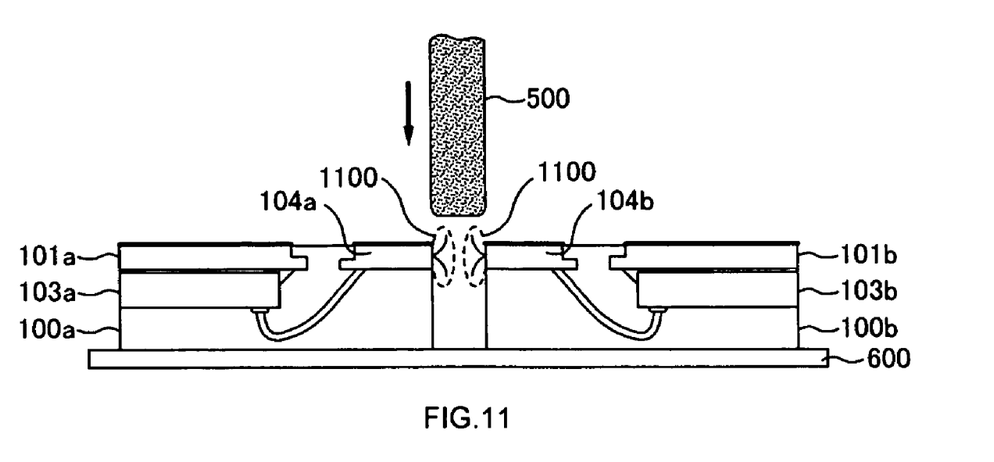
FIG. 11 is a view illustrating a manufacturing step of the semiconductor device according to the embodiment of the present invention.
Figure 12:
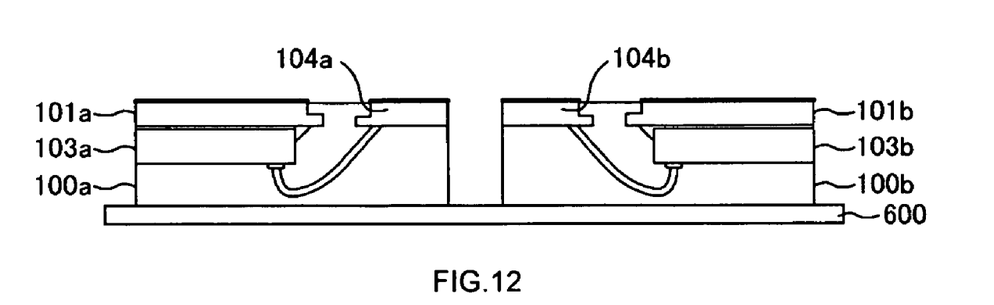
FIG. 12 is a view illustrating a manufacturing step of the semiconductor device according to the embodiment of the present invention.

As with the full-cutting step (S607), the burr removal step (S608) is performed by feeding the work table 800 in the direction of the X-axis (see FIG. 8) for cutting, with each water ejected from the individual nozzles (430, 440, 450). It is to be noted that one of the water ejected from the individual nozzles (430, 440, 450) may be used in the burr removal step (S608). In the case of dry cutting, alternatively, cutting may be performed without using any of the cutting, cooling and cleaning water. Here, the side surfaces of the burr removal blade 500, driven to be rotated together with the spindle 510, rub against the cut cross-sections with the burrs 1100 as shown in FIG. 11, thus allowing the burrs 1100 to be removed as shown in FIG. 12.

Next, after the burr removal step (S608), the conductive foil 700 is precleaned via the precleaning nozzle 900 first and then transferred to the spin cleaning unit (not shown) for spin cleaning. There is a possibility that precleaning and spin cleaning could cause the cutting debris 1110, trapped on the dicing adhesive sheet 600 with much effort in the cutting step, to be trapped again on the conductive foil 700 as a result of the flow of precleaning or spin cleaning water. It is therefore necessary for the cutting device according to the present invention to create a water flow from the dicing region (mounting surface of the conductive foil 700) to its surrounding area, i.e., to the side of the dicing adhesive sheet 600 using precleaning or spin cleaning water if precleaning and spin cleaning is performed.

Figure 13:
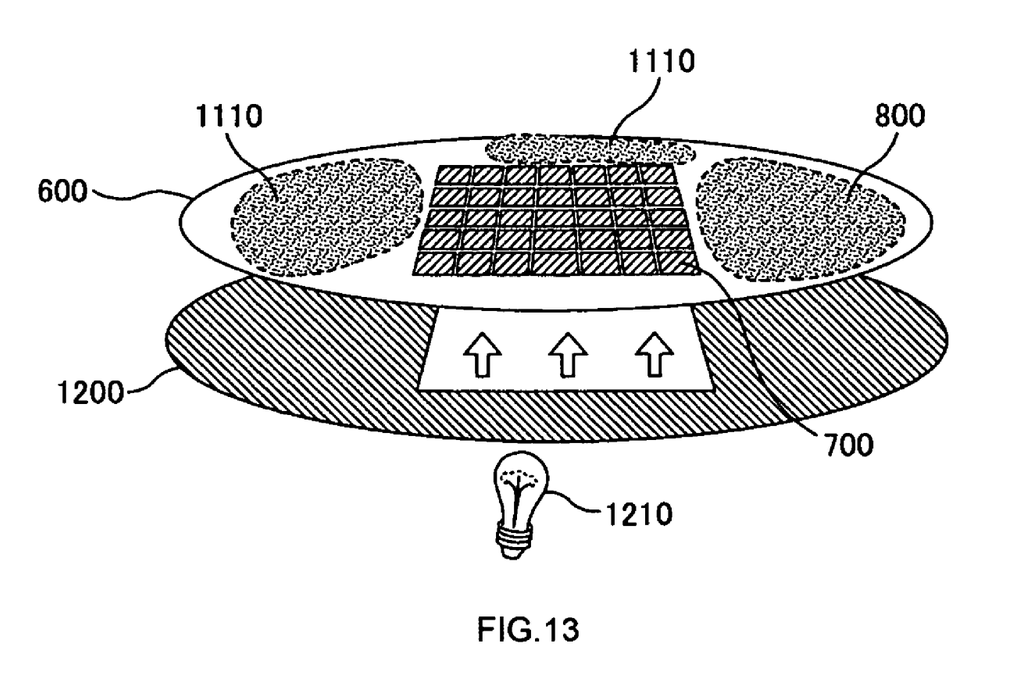
FIG. 13 is a view illustrating a manufacturing step of the semiconductor device according to the embodiment of the present invention.

Following the burr removal step (S608) or the spin cleaning step, the work table 800 is no longer sucked and held, transferring the conductive foil, affixed on the dicing adhesive sheet 600, to a given position for ultraviolet radiation. Then, ultraviolet light is radiated to the back side of the dicing adhesive sheet 600 via an ultraviolet lamp 1210 (S609), as shown in FIG. 13. This causes the portion of the dicing adhesive sheet 600 radiated with ultraviolet light to set and diminish in adhesive strength, detaching the conductive foil 700 from the dicing adhesive sheet 600.

At this time, if ultraviolet light is radiated only to the dicing region, to which the conductive foil 700 is affixed, via a ultraviolet filter 1200 made of an ultraviolet-cutting material, other regions, in which the cutting debris 1110 is trapped, maintain adhesive strength. This makes the cutting debris 1110 less likely to be trapped on the mounting surface of the conductive foil 700 during transfer of the conductive foil 700, affixed on the dicing adhesive sheet 600, in a later step. Therefore, it is preferred that the ultraviolet filter 1200 be used during ultraviolet radiation.

Next, the conductive foil 700, affixed on the dicing adhesive sheet 600, is transferred to a given position for a separation step. Then, as the dicing adhesive sheet 600 is stretched by an expander jig (not shown), each of the sealed bodies 110, i.e., the semiconductor devices 100 is separated from the conductive foil 700 (S610). Then, the individual separated semiconductor devices 100 are subjected to various inspection steps (S611) including visual, process and electrical characteristic inspections, after which only those semiconductor devices screened as acceptable will be eventually shipped.

As described above, the individual separated semiconductor devices 100 are, according to the present invention, separated from the conductive foil 700 by the two cutting steps, namely, the full-cutting and burr removal steps. It is to be noted that the burr removal blade 500, a blade softer and wider than the cutting blade 400 used in the full-cutting step in the direction of rotational axis, is used in the burr removal step. This makes it possible to effectively remove burrs on the cut cross-sections of the bonding pads 104, thus allowing providing the semiconductor devices 100 cleared of burrs.

<Other Embodiments>

While an embodiment of the present invention has been specifically described based on the embodiment, the present invention is not limited thereto and various changes and modifications may be made without departing from the spirit of the invention.

Other Manufacturing Steps of Semiconductor Device

As a cutting device ("second cutting device") for use in another cutting method according to the present invention, a cutting device is employed having a half-cutting blade ("first rotary body") 460 attached at the end of the spindle 400 in place of the cutting blade 400, and a full-cutting blade ("second rotary body") 560 attached at the end of the spindle 510 in place of the burr removal blade 500 in the aforementioned parallel two-axis cutting device 1000 or the opposed two-axis cutting device (see FIG. 4).

Figure 15:
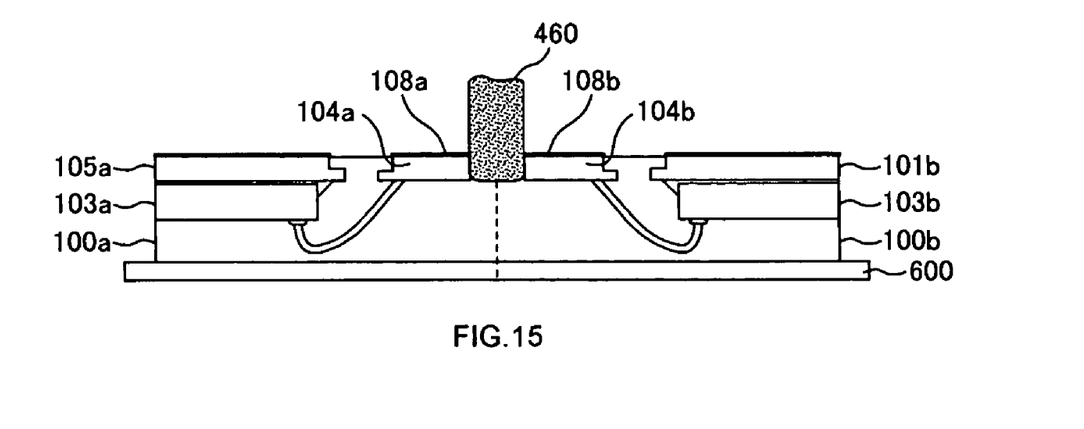
FIG. 15 is a view illustrating a manufacturing step of the semiconductor device according to another embodiment of the present invention.

The half-cutting blade 460 is a blade designed to cut at least the bonding pads 104 stacked at the boundary portions between the individual sealed bodies 110 of the conductive foil 700, and a blade may be used that presents low hardness in conformity with the softness and ductility of the material making up the bonding pad 104.

Figure 16:
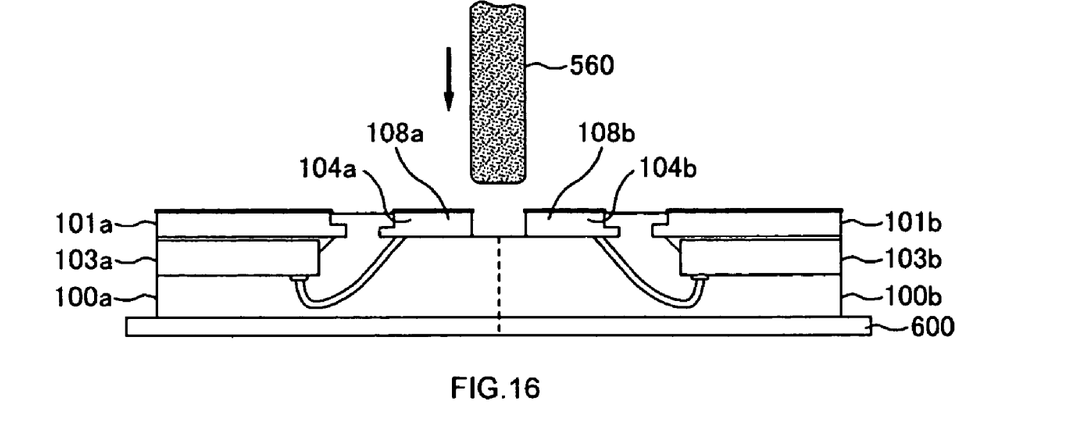
FIG. 16 is a view illustrating a manufacturing step of the semiconductor device according to another embodiment of the present invention.

The full-cutting blade 560, a blade designed to completely cut the sealing agent layer 107 that remains uncut after cutting by the half-cutting blade 460, is made of a material harder than the half-cutting blade 460. It is to be noted that a diamond blade may be used, for example, as the full-cutting blade 560. On the other hand, the full-cutting blade 560 must be narrower than the half-cutting blade 460 in the direction of rotational axis to avoid regeneration of burrs on the cut cross-sections of the bonding pads 104.

Figure 14:
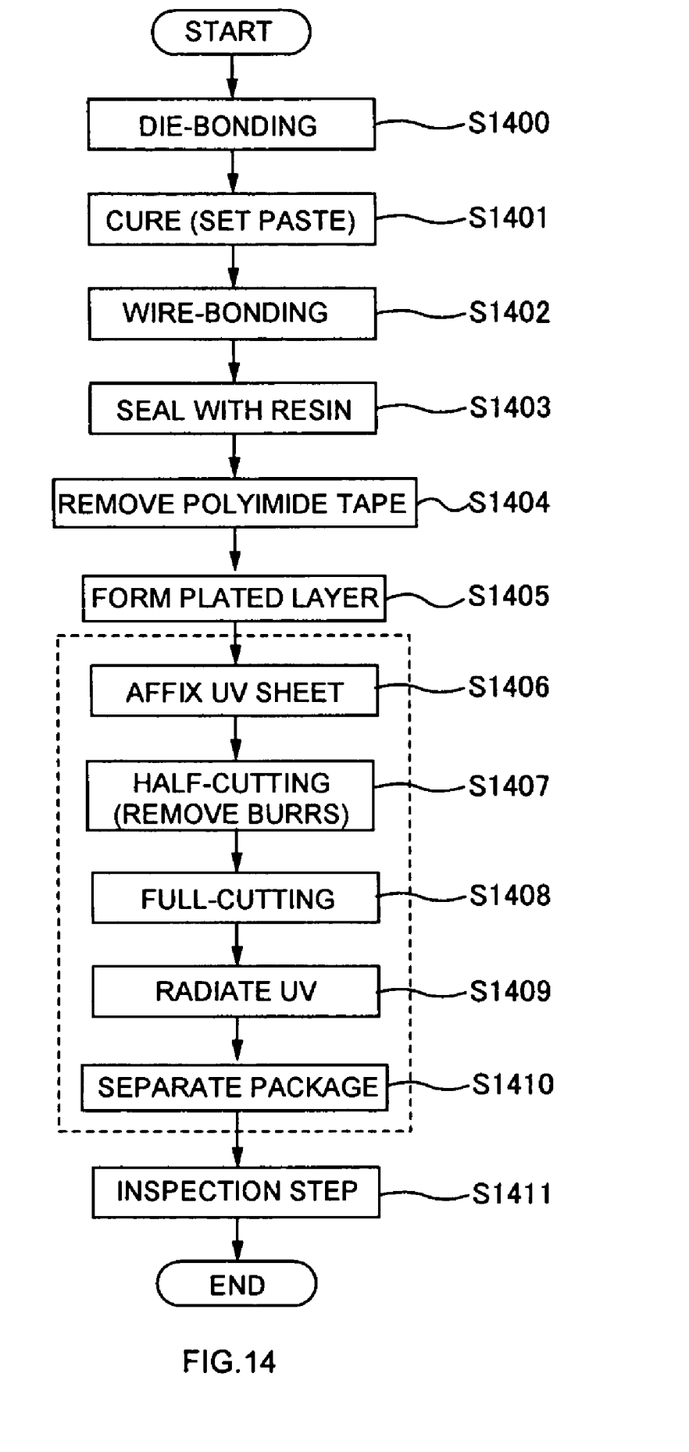
FIG. 14 is a flowchart illustrating manufacturing steps of the semiconductor device according to another embodiment of the present invention.

A description will be made next about manufacturing steps of the semiconductor device based on further cutting method according to the present invention using the flowchart in FIG. 14. Here, differences will be described from the aforementioned manufacturing steps (see FIG. 6). First, the dicing adhesive sheet 600 is affixed to the surface of the conductive foil 700 completely reverse to the mounting surface (S1406), followed by the half-cutting step (S1407).

The half-cutting step (S1407) is performed by moving the half-cutting blade 460, attached at the end of the spindle 410, in the direction of the thickness of the bonding pads 104 ("direction in which first and second layers are stacked") as shown in FIG. 15 while driving to rotate the half-cutting blade 460, thus cutting the bonding pads 104. At this time, cutting using the half-cutting blade 460 makes burrs less likely to be produced on the cut cross-sections of the bonding pads 104.

Under this condition, the full-cutting blade 560, attached at the end of the spindle 510, is moved, as shown in FIG. 16, in the direction of the thickness of the sealing agent layer 107 ("direction in which first and second layers are stacked")—a layer that remains uncut after half-cutting—down to the dicing adhesive sheet 600, thus carrying out the full-cutting step (S1408) for completely cutting the sealing agent layer 107. The full-cutting step is followed by succeeding steps by which the individual semiconductor devices 100 are separated from the conductive foil 700.

Semiconductor Wafer

While, in the aforementioned embodiments, the conductive foil 700, made up by arranging a plurality of the semiconductor devices 100 as a group of semiconductor devices, were shown as examples, the cutting method according to the present invention is applicable to a semiconductor wafer in which a metal wiring layer ("first layer"), made of a material showing soft and ductile properties such as copper or aluminum, is stacked on top of individual partitioned regions in a semiconductor substrate ("second layer") exhibiting hard and brittle properties such as silicon. That is, it is possible, using the cutting method according to the present invention, to effectively remove burrs in the metal wiring layer when individual semiconductor chips are separated from the semiconductor wafer, thus allowing providing semiconductor chips cleared of burrs.

What is claimed is:

1. A cutting method for separating individual semiconductor devices by cutting boundary portions in a group of semiconductor devices made up by arranging a plurality of semiconductor devices in which a ductile first layer and a second layer are stacked on a peripheral side thereof, the cutting method comprising:

a cutting step of cutting the first and second layers by moving a first rotary body from the boundary portions of the group of semiconductor devices in the direction in which the first and second layers are stacked; and     a burr removal step of removing burrs from the first layer by moving a second rotary body, softer than the first rotary body and wider than the first rotary body in the direction of rotational axis, from the cut boundary portions of the group of semiconductor devices in the direction in which the first and second layers are stacked.

2. The cutting method according to claim 1, wherein the second rotary body has a hardness capable of removing the burrs that depends on the hardness of the first layer.

3. The cutting method according to claim 1, wherein water is ejected onto the boundary portions to allow removed burrs to flow out to an outer circumferential side of the group of semiconductor devices in at least one of the cutting and burr removal steps.

4. The cutting method according to claim 1, wherein in a step preceding the cutting step, the group of semiconductor devices is affixed on top of an adhesive material layer in an adhesive sheet in which the adhesive material layer is formed on a base material.

5. The cutting method according to claim 4, wherein the adhesive sheet is an ultraviolet adhesive sheet that sets and diminishes in adhesive strength under ultraviolet radiation, and wherein ultraviolet light is radiated, in a step following the burr removal step, only to a region, in which the group of semiconductor devices is affixed, from the side of the base material surface in the adhesive sheet.

6. The cutting method according to claim 1, wherein, in order to expose electrodes as the first layer around a mounting surface that is joined via a joining agent to a mounting circuit board, the group of semiconductor devices is formed by sealing the electrodes and a semiconductor element, that are electrically connected to each other in each of partitioned regions partitioned on a conductive foil, with a sealing agent as the second layer having an insulating property.

7. The cutting method according to claims 1, the group of semiconductor devices are formed by stacking a metal wiring layer as the first layer on top of each of the partitioned regions in the semiconductor substrate serving as the second layer.

8. A cutting method for separating individual semiconductor devices by cutting boundary portions in a group of semiconductor devices made up by arranging a plurality of semiconductor devices in which a ductile first layer and a second layer are stacked on a peripheral side thereof, the cutting method comprising:

a first cutting step of cutting the first layer and removing burrs from the first layer by moving a first rotary body from the boundary portions of the group of semiconductor devices on the side of the first layer in the direction in which the first and second layers are stacked; and     a second cutting step of cutting the second layer by moving a second rotary body, harder than the first rotary body and narrower than the first rotary body in the direction of rotational axis, from the boundary portions in which the first layer is cut in the direction in which the first and second layers are stacked.

9. The cutting method according to claim 8, wherein the first rotary body has a hardness capable of removing the burrs that depends on the hardness of the first layer.

10. The cutting method according to claim 8, wherein water is ejected onto the boundary portions to allow removed burrs to flow out to an outer circumferential side of the group of semiconductor devices in at least one of the first and second cutting steps.

11. The cutting method according to claim 8, wherein in a step preceding the first cutting step, the group of semiconductor devices is affixed on top of an adhesive material layer in an adhesive sheet in which the adhesive material layer is formed on a base material.

12. The cutting method according to claim 11, wherein the adhesive sheet is an ultraviolet adhesive sheet that sets and diminishes in adhesive strength under UV radiation, and wherein ultraviolet light is radiated, in a step following the burr removal step, only to a region, in which the group of semiconductor devices is affixed, from the side of the base material surface and from the side of other surface completely reverse to the surface on which the group of semiconductor devices is affixed in the adhesive sheet.

13. A semiconductor device manufacturing method for separating individual semiconductor devices by cutting boundary portions in a group of semiconductor devices made up by arranging a plurality of semiconductor devices in which a ductile first layer and a second layer are stacked on a peripheral side thereof, the semiconductor device manufacturing method comprising:

a cutting step of cutting the first and second layers by moving a first rotary body from the boundary portions of the group of semiconductor devices in the direction in which the first and second layers are stacked; and     a burr removal step of removing burrs from the first layer by moving a second rotary body, softer than the first rotary body and wider than the first rotary body in the direction of rotational axis, from the cut boundary portions of the group of semiconductor devices in the direction in which the first and second layers are stacked.

14. A semiconductor device manufacturing method for separating individual semiconductor devices by cutting boundary portions in a group of semiconductor devices made up by arranging a plurality of semiconductor devices in which a ductile first layer and a second layer are stacked on a peripheral side thereof, the semiconductor device manufacturing method comprising:

a first cutting step of cutting the first layer and removing burrs from the first layer by moving a first rotary body from the boundary portions of the group of semiconductor devices on the side of the first layer in the direction in which the first and second layers are stacked; and     a second cutting step of cutting the second layer by moving a second rotary body, harder than the first rotary body and narrower than the first rotary body in the direction of rotational axis, from the boundary portions in which the first layer is cut in the direction in which the first and second layers are stacked.

\* \* \* \* \*